(12) United States Patent
Kim et al.

(10) Patent No.: US 10,622,322 B2
(45) Date of Patent: Apr. 14, 2020

(54) FAN-OUT SEMICONDUCTOR PACKAGE AND METHOD OF MANUFACTURING THE FAN-OUT SEMICONDUCTOR

(71) Applicant: SAMSUNG ELECTRONICS CO., LTD., Suwon-si (KR)

(72) Inventors: Hyoung Joon Kim, Suwon-si (KR); Doo Hwan Lee, Suwon-si (KR); Kyoung Moo Harr, Suwon-si (KR); Kyung Seob Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/632,138

(22) Filed: Jun. 23, 2017

(65) Prior Publication Data
US 2018/0122759 A1    May 3, 2018

(30) Foreign Application Priority Data
Oct. 28, 2016 (KR) .......................... 10-2016-0141781

(51) Int. Cl.
*H01L 23/055* (2006.01)
*H01L 23/00* (2006.01)
(Continued)

(52) U.S. Cl.
CPC .............. *H01L 24/09* (2013.01); *H01L 21/56* (2013.01); *H01L 23/055* (2013.01); *H01L 23/24* (2013.01);
(Continued)

(58) Field of Classification Search
None
See application file for complete search history.

(56) References Cited

U.S. PATENT DOCUMENTS

| 9,355,973 B2 | 5/2016 | Tsai et al. |
| 2005/0161823 A1 | 7/2005 | Jobetto et al. |
| (Continued) | | |

FOREIGN PATENT DOCUMENTS

| CN | 1649119 A | 8/2005 |
| CN | 102201382 A | 9/2011 |
| (Continued) | | |

OTHER PUBLICATIONS

Notice of Office Action issued in Korean Application No. 10-2016-0141781, dated Sep. 18, 2018 (English abstract).
Office Action issued in corresponding Taiwanese Patent Application No. 106120817, dated Feb. 7, 2018, (With English Translation).

*Primary Examiner* — Nishath Yasmeen
(74) *Attorney, Agent, or Firm* — Sughrue Mion, PLLC

(57) ABSTRACT

A fan-out semiconductor package includes a first connection member having a through-hole, a semiconductor chip disposed in the through-hole, the semiconductor chip having an active surface with connection pads disposed thereon and the semiconductor chip having an inactive surface opposing the active surface, an encapsulant, and a second connection member disposed on the first connection member and the active surface of the semiconductor chip, wherein the first connection member and the second connection member include redistribution layers electrically connected to the connection pads, wherein the semiconductor chip includes a first passivation layer disposed on the active surface and the semiconductor chip includes a second passivation layer disposed on the first passivation layer, and wherein the redistribution layer of the second connection member is directly formed on one surface of the second passivation layer and extends onto one surface of the first connection member.

12 Claims, 10 Drawing Sheets

(51) Int. Cl.
*H01L 21/56* (2006.01)
*H01L 23/24* (2006.01)
*H01L 23/31* (2006.01)

(52) U.S. Cl.
CPC .............. *H01L 24/19* (2013.01); *H01L 24/20* (2013.01); *H01L 24/80* (2013.01); *H01L 21/568* (2013.01); *H01L 23/3128* (2013.01); *H01L 2224/04105* (2013.01); *H01L 2224/12105* (2013.01); *H01L 2224/24195* (2013.01); *H01L 2224/24227* (2013.01); *H01L 2225/1035* (2013.01); *H01L 2225/1041* (2013.01); *H01L 2924/14* (2013.01); *H01L 2924/1432* (2013.01); *H01L 2924/14335* (2013.01); *H01L 2924/15174* (2013.01); *H01L 2924/18162* (2013.01); *H01L 2924/19041* (2013.01); *H01L 2924/19042* (2013.01); *H01L 2924/19105* (2013.01); *H01L 2924/3025* (2013.01)

(56) References Cited

U.S. PATENT DOCUMENTS

| 2011/0278736 | A1* | 11/2011 | Lin | H01L 25/50 257/774 |
| 2013/0154091 | A1* | 6/2013 | Wright | H01L 23/49816 257/738 |
| 2013/0249101 | A1* | 9/2013 | Lin | H01L 24/19 257/773 |
| 2014/0264869 | A1* | 9/2014 | Huang | H01L 23/53238 257/751 |
| 2016/0148887 | A1 | 5/2016 | Yu et al. | |

FOREIGN PATENT DOCUMENTS

| CN | 105575913 A | 5/2016 |
| KR | 10-2013-0132163 A | 12/2013 |
| KR | 10-2016-0024379 A | 3/2016 |
| WO | 2015026344 A1 | 2/2015 |

\* cited by examiner

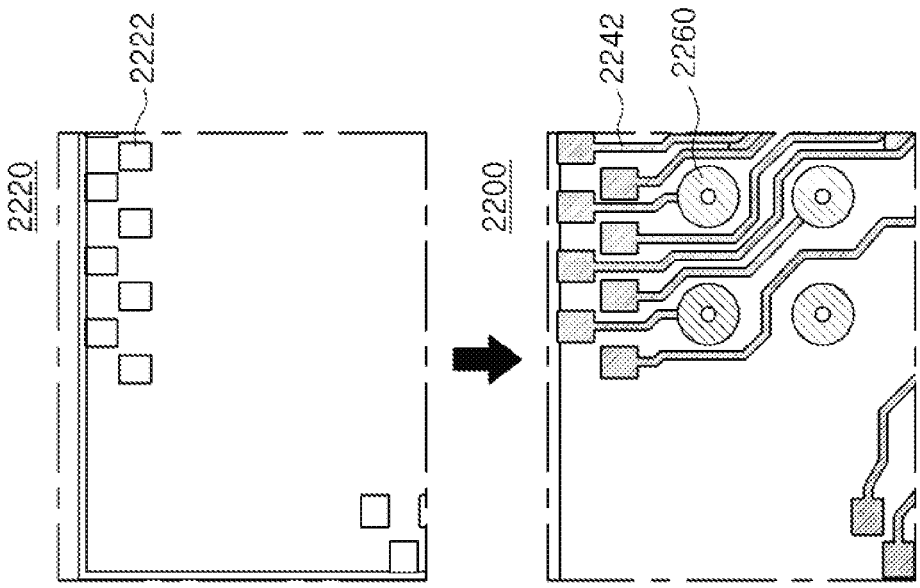
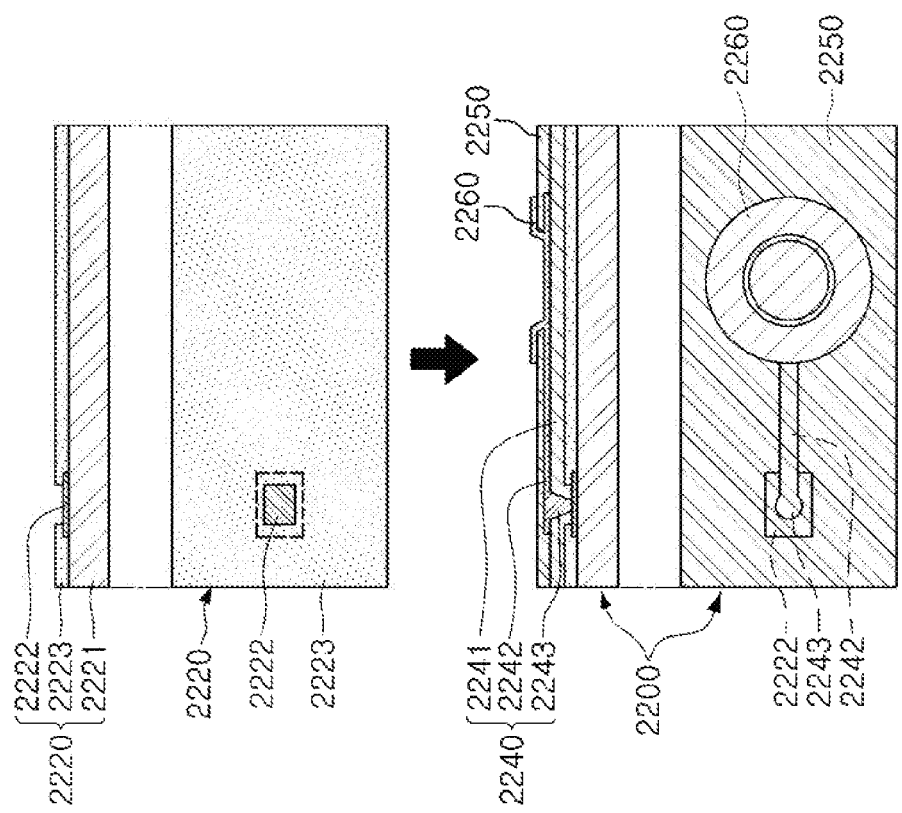
FIG. 3B
FIG. 3A

I - I'

FAN-OUT SEMICONDUCTOR PACKAGE AND METHOD OF MANUFACTURING THE FAN-OUT SEMICONDUCTOR

CROSS-REFERENCE TO RELATED APPLICATION(S)

This application claims the benefit of priority to Korean Patent Application No. 10-2016-0141781 filed on Oct. 28, 2016 with the Korean Intellectual Property Office, the disclosure of which is incorporated herein by reference in its entirety.

TECHNICAL FIELD

The present disclosure relates to a fan-out semiconductor package and a method of manufacturing the same.

BACKGROUND

Recently, a significant trend in the development of technology related to semiconductor chips has been to reduce the size of semiconductor chips. Therefore, in the field of packaging technology, in accordance with a rapid increase in demand for small-sized semiconductor chips, and the like, the implementation of a semiconductor package having a compact size while including a plurality of pins, has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package able to be manufactured to have a subminiature size and an ultra-thin thickness to reduce a cost, and a method of manufacturing the same.

According to an aspect of the present disclosure, a fan-out semiconductor package may be provided, in which a connection member having a through-hole and including a redistribution layer is introduced into a region in which a semiconductor chip is disposed and a redistribution layer is directly formed on an outermost passivation layer protecting the connection member and an active surface of the semiconductor chip to electrically connect the redistribution layer of the connection member and connection pads of the semiconductor chip to each other.

According to an aspect of the present disclosure, a fan-out semiconductor package may include: a first connection member having a through-hole; a semiconductor chip disposed in the through-hole and having an active surface with connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip, wherein the first connection member and the second connection member include, respectively, redistribution layers electrically connected to the connection pads, the semiconductor chip includes a first passivation layer disposed on the active surface and a second passivation layer disposed on the first passivation layer, and the redistribution layer of the second connection member is directly formed on one surface of the second passivation layer and extends onto one surface of the first connection member.

According to an aspect of the present disclosure, a method of manufacturing a fan-out semiconductor package may include: preparing a first connection member having a through-hole and including a redistribution layer; disposing a semiconductor chip in the through-hole, the semiconductor chip having an active surface with connection pads disposed thereon and an inactive surface opposing the active surface and including a first passivation layer disposed on the active surface and a second passivation layer disposed on the first passivation layer; forming an encapsulant encapsulating at least portions of the first connection member and the inactive surface of the semiconductor chip; and forming a second connection member by directly forming a redistribution layer on one surface of the first connection member and one surface of the second passivation layer, the redistribution layer of the second connection member being in contact with the redistribution layer of the first connection member and the connection pads of the semiconductor chips.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged according to exemplary embodiments of the present disclosure;

DETAILED DESCRIPTION

Figure 1:
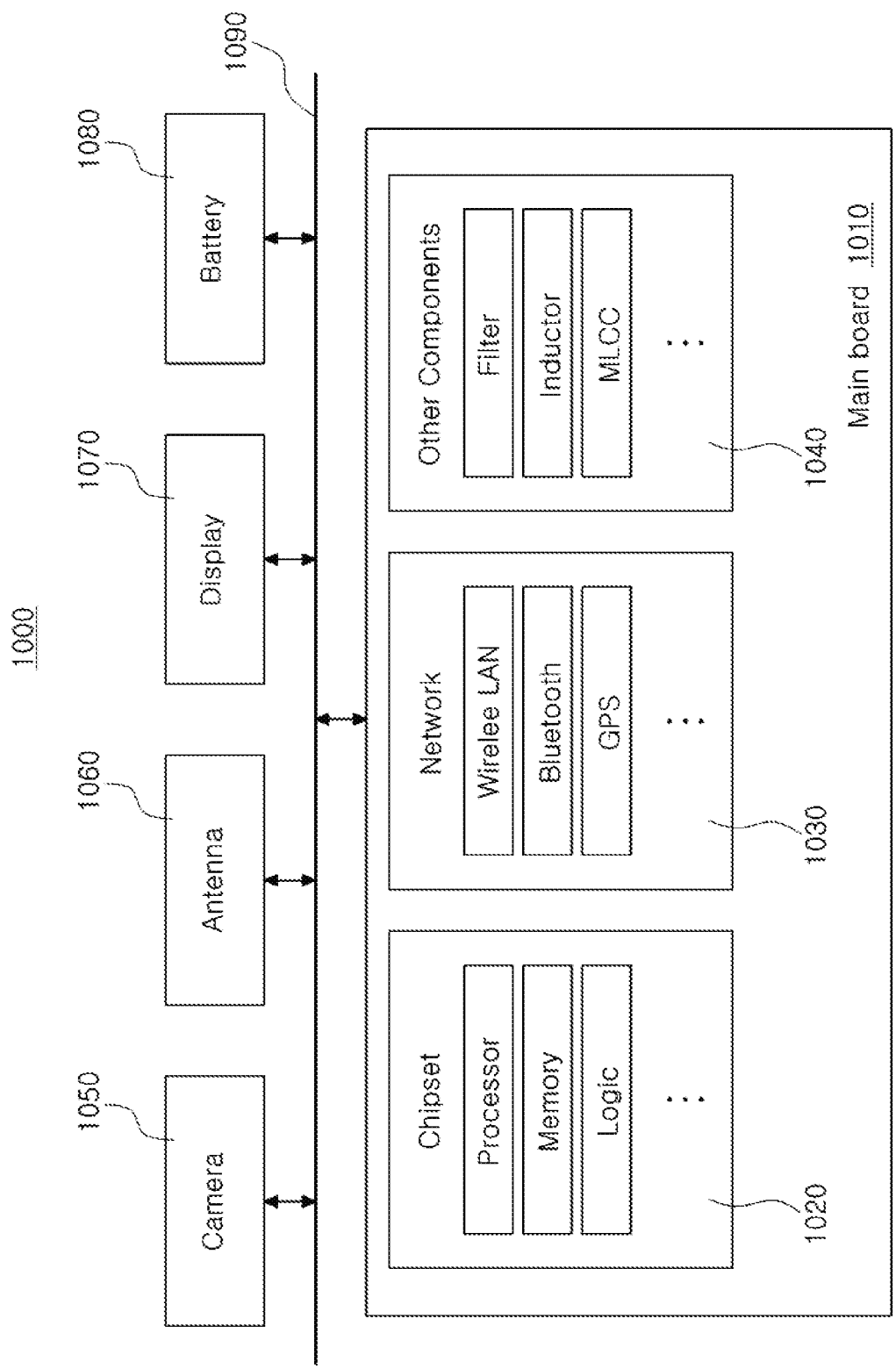
FIG. 1 is a schematic block diagram illustrating an example of an electronic device system according to exemplary embodiments of the present disclosure.

Hereinafter, exemplary embodiments of the present disclosure will be described with reference to the accompanying drawings. In the accompanying drawings, shapes, sizes, and the like, of components may be exaggerated or re-sized for clarity.

The term "an exemplary embodiment" used herein may not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or relative importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are as depicted in the attached drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe exemplary embodiments rather than limiting the present disclosure. In this case, singular forms include plural forms unless interpreted otherwise in context.

Electronic Device

FIG. 1 is a schematic block diagram illustrating an example of an electronic device system according to exemplary embodiments of the present disclosure.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
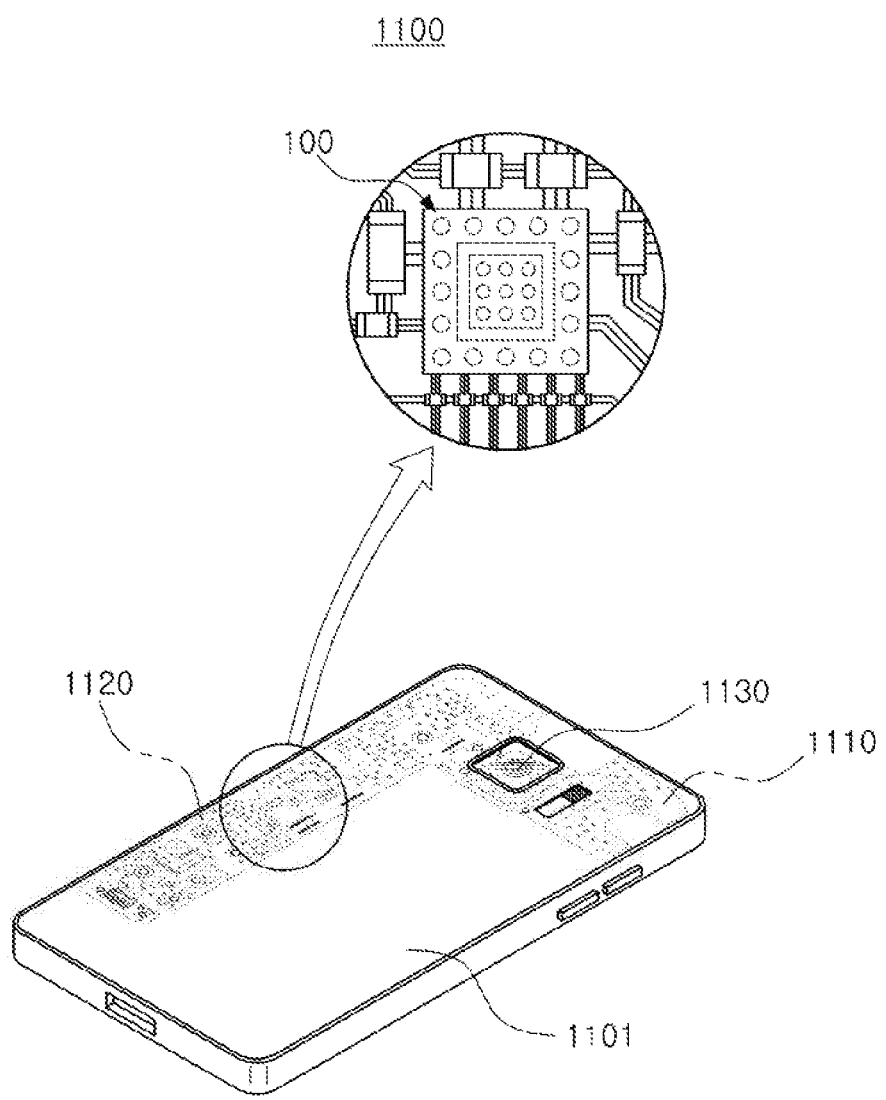
FIG. 2 is a perspective view illustrating an example of an electronic device according to exemplary embodiments of the present disclosure.

FIG. 2 is a perspective view illustrating an example of an electronic device according to exemplary embodiments of the present disclosure.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine, or miniaturized, electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are cross-sectional views illustrating states of a fan-in semiconductor package before and after being packaged according to exemplary embodiments of the present disclosure.

Figure 4:
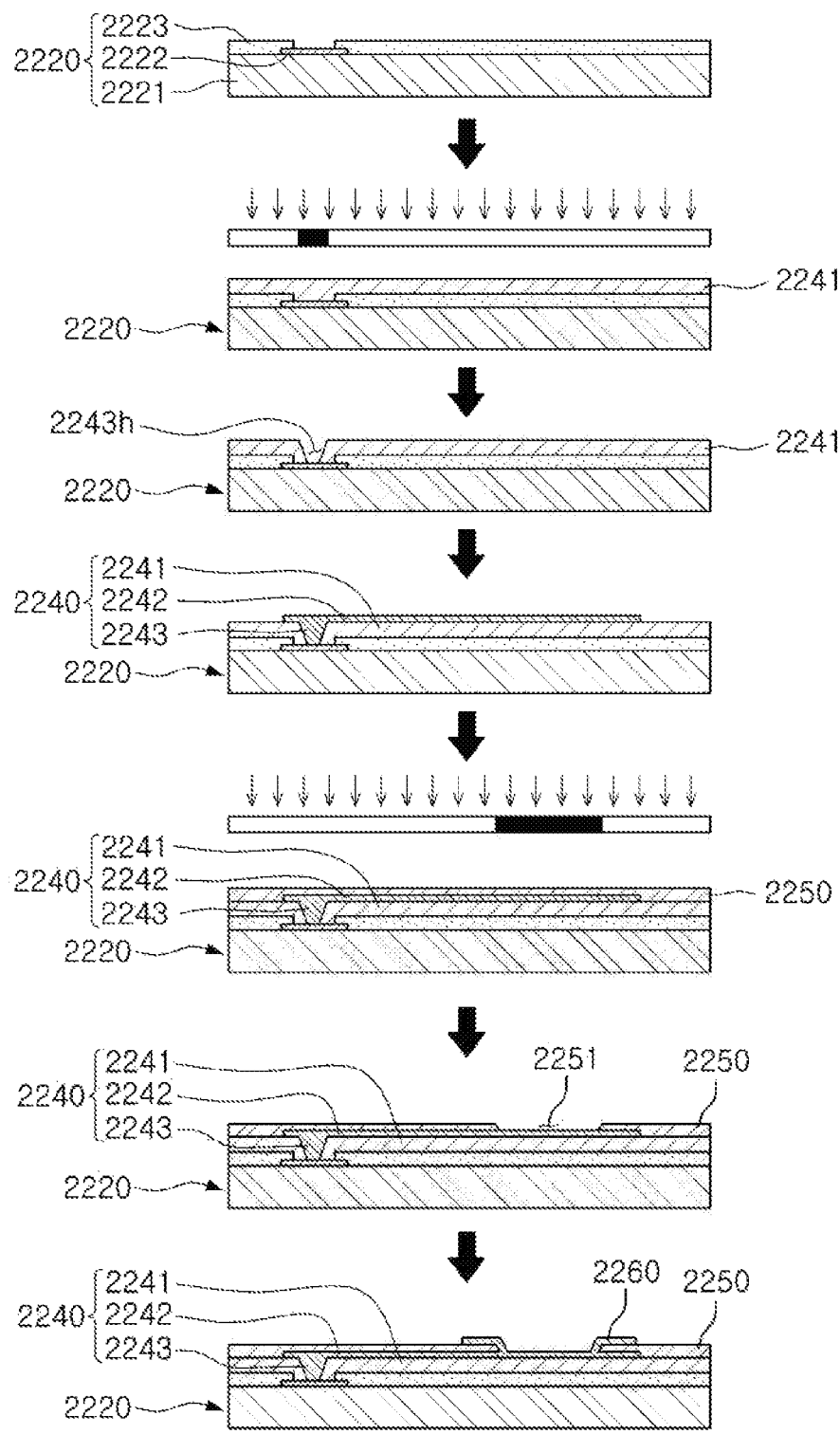
FIG. 4 is a cross-sectional process view illustrating a packaging process of a fan-in semiconductor package according to exemplary embodiments of the present disclosure.

FIG. 4 is a cross-sectional process view illustrating a packaging process of a fan-in semiconductor package according to exemplary embodiments of the present disclosure.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it may be difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
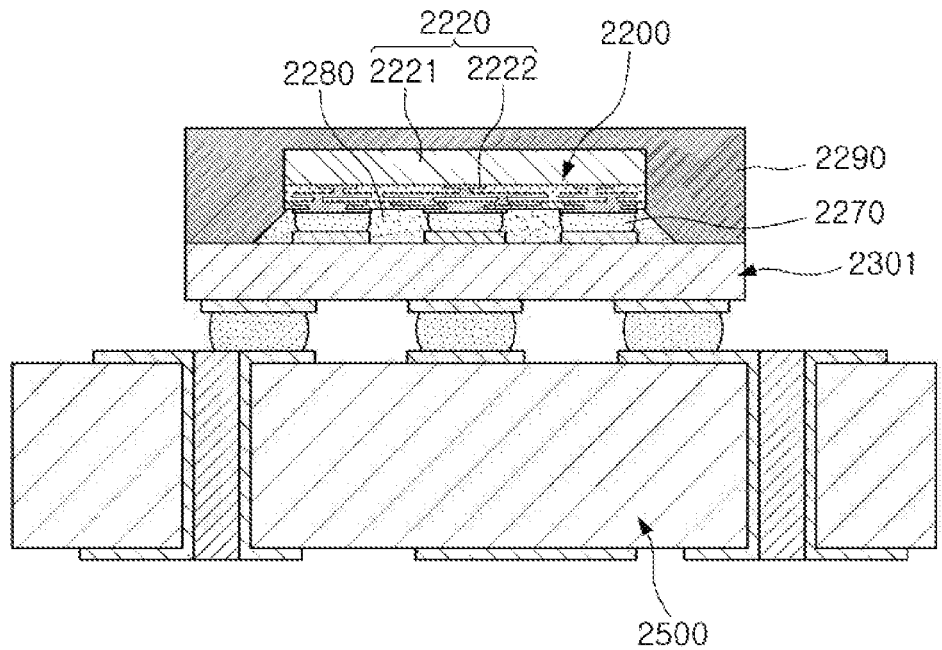
FIG. 5 is a cross-sectional view illustrating a case in which a fan-in semiconductor package is mounted on an interposer substrate and is ultimately mounted on a main board of an electronic device according to exemplary embodiments of the present disclosure.

FIG. 5 is a cross-sectional view illustrating a case in which a fan-in semiconductor package is mounted on an interposer substrate and is ultimately mounted on a main board of an electronic device according to exemplary embodiments of the present disclosure.

Figure 6:
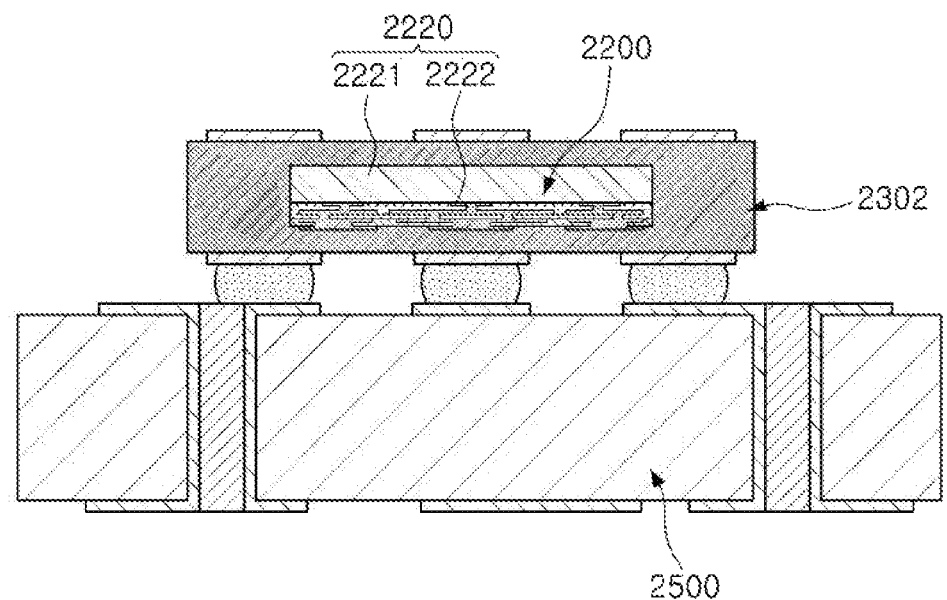
FIG. 6 is a cross-sectional view illustrating a case in which a fan-in semiconductor package is embedded in an interposer substrate and is ultimately mounted on a main board of an electronic device according to exemplary embodiments of the present disclosure.

FIG. 6 is a cross-sectional view illustrating a case in which a fan-in semiconductor package is embedded in an interposer substrate and is ultimately mounted on a main board of an electronic device according to exemplary embodiments of the present disclosure.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
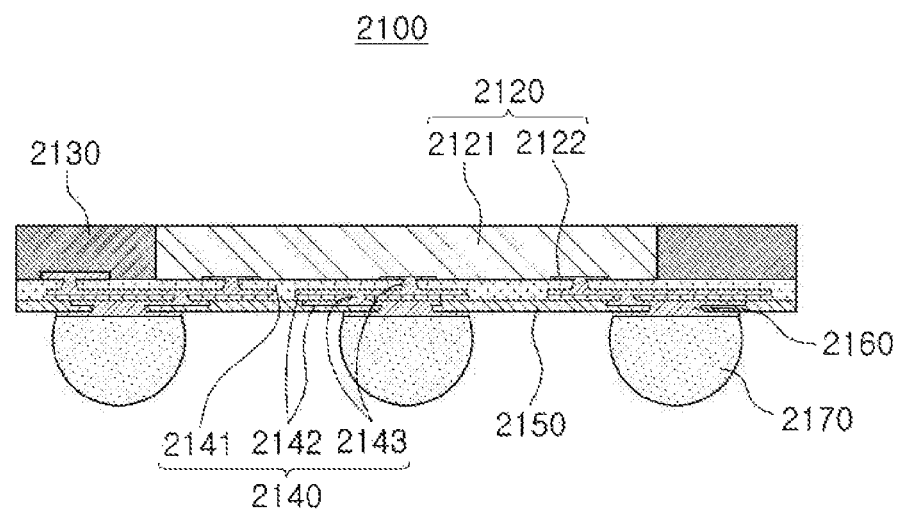
FIG. 7 is a cross-sectional view illustrating a fan-out semiconductor package according to exemplary embodiments of the present disclosure.

FIG. 7 is a cross-sectional view illustrating a fan-out semiconductor package according to exemplary embodiments of the present disclosure.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be formed on the connection member 2140, and underbump metal layers 2160 may be formed in openings of the passivation layer 2150. Solder balls 2170 may be formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls needs to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
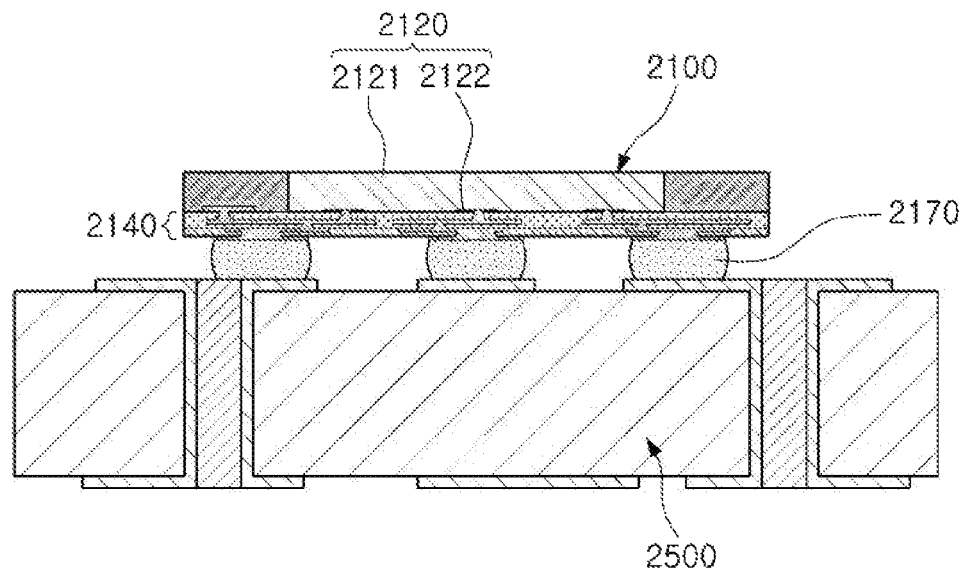
FIG. 8 is a cross-sectional view illustrating a case in which a fan-out semiconductor package is mounted on a main board of an electronic device according to exemplary embodiments of the present disclosure.

FIG. 8 is a cross-sectional view illustrating a case in which a fan-out semiconductor package is mounted on a main board of an electronic device according to exemplary embodiments of the present disclosure.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of being manufactured at a subminiature size and an ultra-thin thickness to reduce manufacturing costs, and a method of manufacturing the same will hereinafter be described with reference to the drawings.

Figure 9:
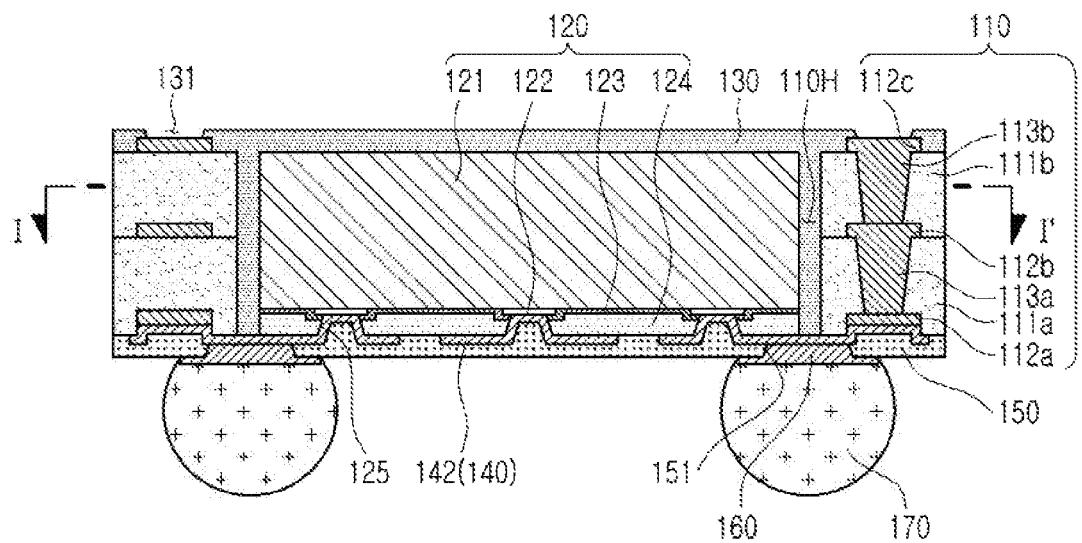
FIG. 9 is a cross-sectional view illustrating an example of a fan-out semiconductor package according to exemplary embodiments of the present disclosure.

FIG. 9 is a cross-sectional view illustrating an example of a fan-out semiconductor package according to exemplary embodiments of the present disclosure.

Figure 10:
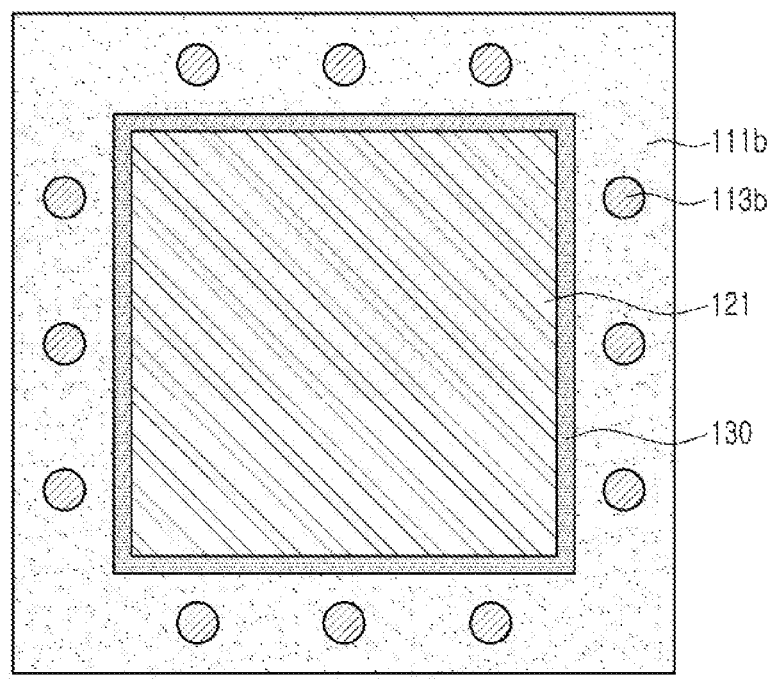
FIG. 10 is a schematic plan view taken along line I-I' of FIG. 9.

FIG. 10 is a schematic plan view taken along line I-I' of the fan-out semiconductor package of FIG. 9.

Referring to the drawings, a fan-out semiconductor package 100 according to an exemplary embodiment of the present disclosure may include a first connection member 110 having a through-hole 110H, a semiconductor chip 120 disposed in the through-hole 110H of the first connection member 110, having an active surface with connection pads 122 disposed thereon and an inactive surface opposing the active surface, and including a first passivation layer 123 disposed on the active surface and a second passivation layer 124 disposed on the first passivation layer 123, an encapsulant 130 encapsulating at least portions of the first connection member 110 and the semiconductor chip 120, and a second connection member 140 disposed on the first connection member 110 and the active surface of the semiconductor chip 120. The first connection member 110 may include redistribution layers 112a, 112b, and 112c electrically connected to the connection pads 122 of the semiconductor chip 120. The second connection member 140 may also include a redistribution layer 142 electrically connected to the connection pads 122 of the semiconductor chip 120. The redistribution layer 142 of the second connection member 140 may be formed on one surface of the second passivation layer 124 of the semiconductor chip 120 without a separate insulating layer interposed therebetween and extend onto one surface of the first connection member 110. As described above, the first connection member 110 may include the redistribution layers 112a, 112b, and 112c to thus reduce the number of layers of the second connection member 140, and the first connection member 110 may be formed before the semiconductor chip 120 is disposed, such that a decrease in a yield of the semiconductor chip 120 may be solved. In addition, since the redistribution layer 142 is directly formed on the second passivation layer 124 of the semiconductor chip 120 by plating, or the like, and extends to the first connection member 110, an insulating layer required in the related area in order to form the redistribution layer 142 may be omitted, and miniaturization and thinness of the fan-out semiconductor package and a cost reduction of the fan-out semiconductor package may thus be possible. The meaning that the redistribution layer 142 is directly formed on the second passivation layer 124 is that the redistribution layer 142 is formed on the second passivation layer 124 by plating, or the like, using the second passivation layer 124 as an insulating layer.

Meanwhile, the semiconductor chip 120 may have openings 125 penetrating through the first and second passivation layers 123 and 124 and exposing at least portions of the connection pads 122, and the redistribution layer 142 of the second connection member 140 may be disposed on the exposed connection pads 122 and walls of the openings 125, resulting in contact with the connection pads 122 of the semiconductor chip 120. In addition, the first connection member 110 may have a recessed portion formed inwardly in one surface thereof in contact with the second connection member 140, and the redistribution layer 142 of the second connection member 140 may be disposed in the recessed portion, resulting in contact with the redistribution layer 112a of the first connection member 110. As described above, the redistribution layer 142 of the second connection member 140 may be in direct contact with the connection pads 122 of the semiconductor chip 120 and the redistribution layer 112a of the first connection member 110, and may electrically connect the connection pads 122 of the semiconductor chip 120 and the redistribution layer 112a of the first connection member 110 to each other, such that a degree of freedom in a wiring design may be high, in spite of the miniaturization and the thinning of the fan-out semiconductor package.

Meanwhile, the encapsulant 130 may fill at least portions of spaces between walls of the through-hole 110H and side surfaces of the semiconductor chip 120, and the redistribution layer 142 of the second connection member 140 may extend onto one surface of the encapsulant 130 filling at least portions of the spaces between the walls of the through-hole 110H and the side surfaces of the semiconductor chip 120.

In this case, one surface of the second passivation layer 124, one surface of the encapsulant 130, and one surface of the first connection member 110 on which the redistribution layer 142 of the second connection member 140 is formed may be disposed on the same level. Here, the same level is a concept including a case in which one surface of the second passivation layer, one surface of the encapsulant, and one surface of the first connection member are disposed on approximately the same plane due to an error in a process as well as a case in which they are entirely disposed on the same plane. As described above, since the redistribution layer 142 of the second connection member 140 may be formed on a flat surface, the redistribution layer 142 may be smoothly formed without causing a problem such as a plating defect, or the like.

The respective components included in the fan-out semiconductor package according to exemplary embodiments will hereinafter be described below in more detail.

The first connection member 110 may maintain rigidity of the fan-out semiconductor package depending on certain materials, and serve to secure uniformity of a thickness of the encapsulant 130. The fan-out semiconductor package may be used as a portion of a package-on-package (POP) by the first connection member 110. The first connection member 110 may include a plurality of redistribution layers 112a, 112b, and 112c to effectively redistribute the connection pads 122 of the semiconductor chip 120, and may provide a wide wiring design region to significantly suppress redistribution layers from being formed in other regions. The semiconductor chip 120 may be disposed in the through-hole 110H to be spaced apart from the first connection member 110 by a predetermined distance. The side surfaces of the semiconductor chip 120 may be surrounded by the first connection member 110. A separate passive component such as a capacitor or an inductor may further be disposed in the through-hole 110H, and may be electrically connected to the semiconductor chip 120.

The first connection member 110 may include a first insulating layer 111a, a first redistribution layer 112a in contact with the redistribution layer 142 of the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to the connection pads 122. The first and second redistribution layers 112a and 112b and the second and third redistribution layers 112b and 112c may be electrically connected to each other through first and second vias 113a and 113b each penetrating through the first and second insulating layers 111a and 111b, respectively.

Since the first connection member 110 may include a large number of redistribution layers 112a, 112b, and 112c, the second connection member 140 may further be simplified. Therefore, a decrease in a yield depending on a defect occurring in a process of forming the second connection member 140 may be suppressed, and the second connection member 140 may be thinned. The first redistribution layer 112a may be recessed into the first insulating layer 111a, such that a lower surface of the first insulating layer 111a and a lower surface of the first redistribution layer 112a have a step therebetween. That is, the first connection member 110 may have the recessed portion. When an encapsulant 130 is formed, a phenomenon in which a material of the encapsulant 130 bleeds to pollute the first redistribution layer 112a may be prevented by the recessed portion.

The second redistribution layer 112b of the first connection member 110 may be disposed on a level between the active surface and the inactive surface of the semiconductor chip 120. The first connection member 110 may be formed to have a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed to have large sizes, depending on a scale of the first connection member 110, by, for example, a substrate process. On the other hand, the redistribution layer 142 of the second connection member 140 formed through a fine circuit process such as a semiconductor process may be formed at a relatively small size for thinness.

For example, a material including an inorganic filler and an insulating resin may be used as materials of the insulating layers 111a and 111b. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Buildup Film (ABF), FR-4, Bismaleimide Triazine (BT), a photoimagable dielectric (PID) resin, BT, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used as the insulating material.

The redistribution layers 112a, 112b, and 112c may include a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions depending on designs of their corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include pad patterns for vias, pad patterns for connection terminals, and the like.

A material of each of the vias 113a and 113b may be a conductive material. Each of the vias 113a and 113b may be completely filled with the conductive material, or the conductive material may also be formed along a wall of each of via holes. When holes for the vias 113a and 113b are formed, some of the pad patterns of the first redistribution layer 112a and the second redistribution layer 112b may serve as a stopper, and it may be thus advantageous in a process that each of the vias 113a and 113b has a tapered shape of which a width of an upper surface is greater than that of a lower surface. In this case, the vias 113a and 113b may be integrated with portions of the second redistribution layer 112b and the third redistribution layer 112c, respectively.

The semiconductor chip 120 may be an integrated circuit (IC) provided in an amount of several hundreds to several millions of elements, or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may include a body 121, the connection pads 122 formed on the body 121, the first passivation layer 123 formed on the body 121 and covering at least portions of the connection pads 122, and the second passivation layer 124 disposed on the first passivation layer 123. The semiconductor chip 120 may have the openings 125 penetrating through the first and second passivation layers 123 and 124 and exposing at least portions of the connection pads 122. In addition, an insulating layer (not illustrated), or the like, may further be disposed in other required positions such as a position between the body 121 and the connection pads 122, a position between the body 121 and the first passivation layer 123, or the like.

The semiconductor chip 120 may be formed on the basis of an active wafer. In this case, a base material of the body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. The first passivation layer 123 may be an oxide layer formed of $SiO_2$, or the like, a nitride layer formed of $Si_xN_y$, or the like, or be a double layer of an oxide layer and a nitride layer. The second passivation layer 124 may be an organic insulating layer including the known organic material. For example, the second passivation layer 124 may be a photosensitive or non-photosensitive polyimide layer. The second passivation layer 124 formed of polyimide, or the like, may also be a type of polymer insulating material and serve as an insulating layer of a wiring, and the redistribution layer 142 may thus be directly formed on the second passivation layer 124 without requiring an additional insulating layer.

The encapsulant 130 may protect the semiconductor chip 120. An encapsulation form of the encapsulant 130 is not particularly limited, and may be a form in which the encapsulant 130 surrounds at least portions of the semiconductor chip 120. For example, the encapsulant 130 may cover at least portions of the first connection member 110 and the inactive surface of the semiconductor chip 120, and fill the spaces between the walls of the through-hole 110H and the side surfaces of the semiconductor chip 120. Certain materials of the encapsulant 130 are not particularly limited. For example, an insulating material may be used as the certain materials of the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, the known molding material such as an epoxy molding compound (EMC), or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The second connection member 140 may redistribute the connection pads 122 of the semiconductor chip 120. Several ten to several hundred connection pads 122 having various functions may be redistributed by the second connection member 140, and may be physically or electrically connected to an external source through connection terminals 170 depending on the functions. The second connection member 140 may include the redistribution layer 142 directly formed on one surface of the second passivation layer 124 of the semiconductor chip 120 and extending onto the encapsulant 130 and the first connection member 110. The redistribution layer 142 may be disposed on the exposed connection pads 122 of the semiconductor chip 120 and the walls of the openings 125, resulting in contact with the connection pads 122. The redistribution layer 142 may be disposed in the recessed portion of the first connection member 110, resulting in contact with the redistribution layer 112a. The first connection member 110 and the semiconductor chip 120 may be electrically connected to each other through the redistribution layer 142.

A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include various kinds of pad patterns.

A passivation layer 150 may be additionally configured to protect the second connection member 140 from external physical or chemical damage. The passivation layer 150 may have openings 151 exposing at least portions of the redistribution layer 142 of the second connection member 140. The openings may be provided in an amount of several tens to several thousands. A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF, including an inorganic filler and an epoxy resin, may be used as the material of the passivation layer 150. When the insulating material including the inorganic filler and the insulating resin, such as the ABF, or the like, is used as the material of the passivation layer 150, an insulating layer 141 of the second connection member 140 may also include an inorganic filler and an insulating resin.

An underbump metal layer 160 may be additionally configured to improve connection reliability of the connection terminals 170 and improve board level reliability of the fan-out semiconductor package. The underbump metal layer 160 may be connected to the redistribution layer 142 of the second connection member 140 opened through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package. For example, the fan-out semiconductor package may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be improved.

At least one of the connection terminals 170 may be disposed in a fan-out region. The fan-out region is a region except for a region in which the semiconductor chip 120 is disposed. That is, the fan-out semiconductor package according to exemplary embodiments may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Meanwhile, although not illustrated in the drawings, a metal layer may further be disposed on the wall of the through-hole 110H, if necessary. The metal layer may serve to effectively dissipate heat generated by the semiconductor chip 120. In addition, the metal layer may also serve to block electromagnetic waves. In addition, a separate passive component such as a capacitor, an inductor, or the like, may further be disposed in the through-hole 110H. In addition, a plurality of semiconductor chips 120 may be disposed in the through-hole 110H. In addition, the number of through-holes 110H may be plural and semiconductor chips 120 or passive components may be disposed in the through-holes 110H, respectively. In addition to the structures described above, structures known in the related art may be applied.

Figure 11A:
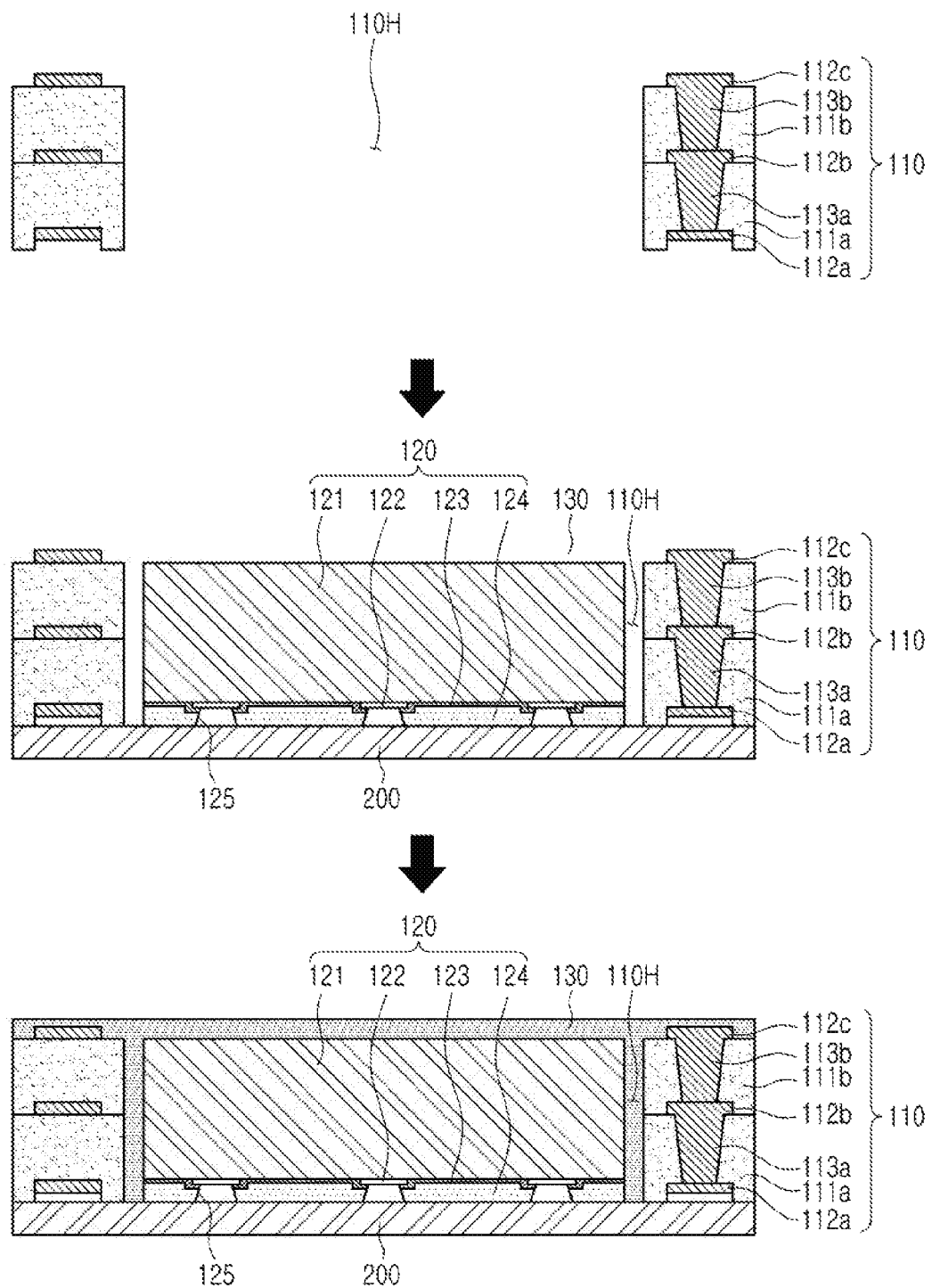
FIGS. 11A and 11B are schematic views illustrating an example of processes of manufacturing the fan-out semiconductor package of FIG. 9.
Figure 11B:
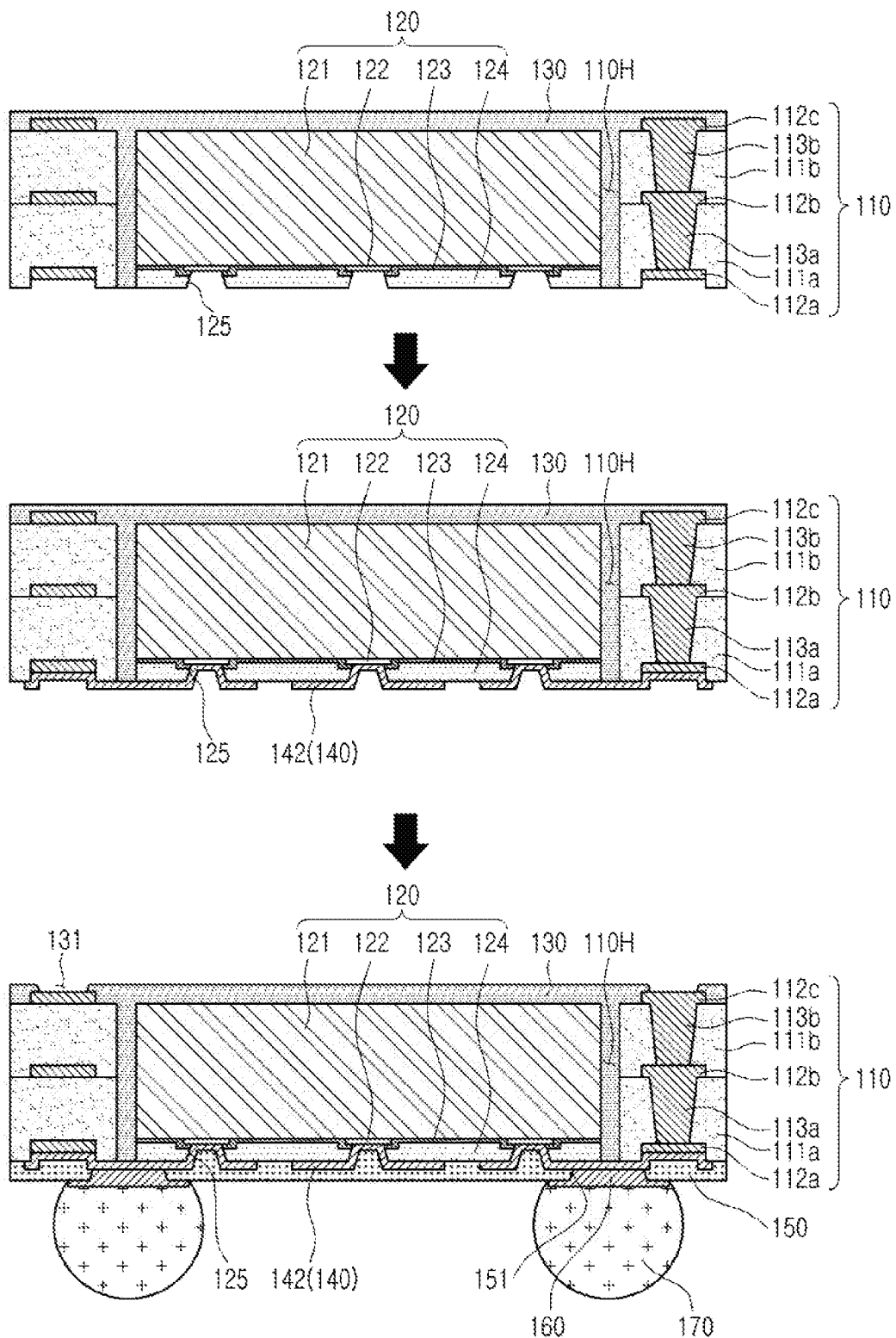

FIGS. 11A and 11B are views illustrating an example of processes of manufacturing the fan-out semiconductor package of FIG. 9.

Referring to FIG. 11A, the first connection member 110 having the through-hole 110H may be first prepared. The first connection member 110 may be prepared by, for example, preparing a carrier film having a metal layer formed on one surface or opposite surfaces thereof, forming the first redistribution layer 112a using the metal layer as a seed layer, forming the first insulating layer 111a covering the first redistribution layer 112a on the metal layer, forming the second redistribution layer 112b on the first insulating layer 111a, forming the second insulating layer 111b covering the second redistribution layer 112b on the first insulating layer 111a, forming the third redistribution layer 112c on the second insulating layer 111b to form the first connection member 110, separating the first connection member 110 from the carrier film, and then removing the metal layer remaining on the first redistribution layer 112a. When the metal layer is removed, the recessed portion may be formed in the first connection member 110. The redistribution layers 112a, 112b, and 112c may be formed by performing patterning using a dry film, or the like, and filling patterns by the known plating process. The insulating layers 111a and 111b may be formed by the known lamination method or applying and hardening method.

Then, an adhesive film 200 may be attached on one surface of the first connection member 110. Any material that may fix the first connection member 110 may be used as the adhesive film 200. As a non-restrictive example, the known tape, or the like, may be used. An example of the known tape may include a thermosetting adhesive tape of which adhesion is weakened by heat treatment, an ultraviolet-curable adhesive tape of which adhesion is weakened by ultraviolet ray irradiation, or the like. Then, the semiconductor chip 120 may be disposed in the through-hole 110H of the first connection member 110. For example, the semiconductor chip 120 may be disposed by a method of attaching the semiconductor chip 120 to the adhesive film 200 in the through-hole 110H. The semiconductor chip 120 may be disposed in a face-down form so that the active surface on which the connection pads 122 are disposed is attached to the adhesive film 200. Meanwhile, the semiconductor chip 120 may include the first and second passivation layers 123 and 124 disposed on the active surface on which the connection pads 122 are disposed. In this case, the semiconductor chip 120 may be attached to the adhesive film 200 in a state in which the openings 125 penetrating through the first and second passivation layers 123 and 124 and exposing at least portions of the connection pads 122 are already formed in a process of forming the semiconductor chip 120.

Then, the semiconductor chip 120 may be encapsulated using the encapsulant 130. The encapsulant 130 may encapsulate at least the first connection member 110 and the inactive surface of the semiconductor chip 120, and may fill at least portions of a space within the through-hole 110H. The encapsulant 130 may be formed by a known method. For example, the encapsulant 130 may be formed by laminating a precursor of the encapsulant 130 and then hardening the precursor. Alternatively, the encapsulant 130 may be formed by a method of applying a pre-encapsulant to the adhesive film 200 to encapsulate the semiconductor chip 120 and then hardening the pre-encapsulant.

Then, referring to FIG. 11B, the adhesive film 200 may be peeled off. A method of peeling off the adhesive film 200 is not particularly limited, but may be the known method. For example, when the thermosetting adhesive tape of which adhesion is weakened by heat treatment, the ultraviolet-curable adhesive tape of which adhesion is weakened by ultraviolet ray irradiation, or the like, is used as the adhesive film 200, the adhesive film 200 may be peeled off after the adhesion of the adhesive film 200 is weakened by heat-treating the adhesive film 200 or may be peeled off after the adhesion of the adhesive film 200 is weakened by irradiating an ultraviolet ray to the adhesive film 200.

Then, the second connection member 140 may be formed on the first connection member 110 and the active surface of the semiconductor chip 120 from which the adhesive film 200 is removed. The second connection member 140 may be formed by directly forming the redistribution layer 142 on the exposed connection pads 122, the walls of the openings 125, and one surface of the second passivation layer 124 by plating, or the like. The redistribution layer 142 may extend onto one surface of the encapsulant 130 and one surface of the first connection member 110. In this case, the redistribution layer 142 may be formed in the recessed portion of the first connection member 110, resulting in contact with the first redistribution layer 112a of the first connection member 110. That is, the redistribution layer 142 may be directly formed using the second passivation layer 124 of the semiconductor chip 120. Therefore, a separate insulating layer may be omitted, and miniaturization and thinness of the fan-out semiconductor package and a cost reduction of the fan-out semiconductor package may thus be possible.

Then, the passivation layer 150 may be formed on the second connection member 140, if necessary. The passivation layer 150 may also be formed by a method of laminating a precursor of the passivation layer 150 and then hardening the precursor, a method of applying a material for forming the passivation layer 150 and then hardening the material, or the like. The openings 151 may be formed in the passivation layer 150 to expose at least portions of the redistribution layer 142 of the second connection member 140, and the underbump metal layer 160 may be formed in the openings 151 by the known metallization method. The connection terminals 170 may be formed on the underbump metal layer 160, if necessary. A method of forming the connection terminals 170 is not particularly limited. That is, the connection terminals 170 may be formed by the method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. In addition, openings 131 penetrating through the encapsulant 130 and exposing at least portions of the third redistribution layer 112c of the first connection member 110 may be formed, if necessary.

Meanwhile, a series of processes may be processes of preparing the carrier film having a large size, manufacturing a plurality of fan-out semiconductor packages, and then singulating the plurality of fan-out semiconductor packages into individual fan-out semiconductor packages through a sawing process in order to facilitate mass production. In this case, productivity may be excellent and/or improved.

Figure 12:
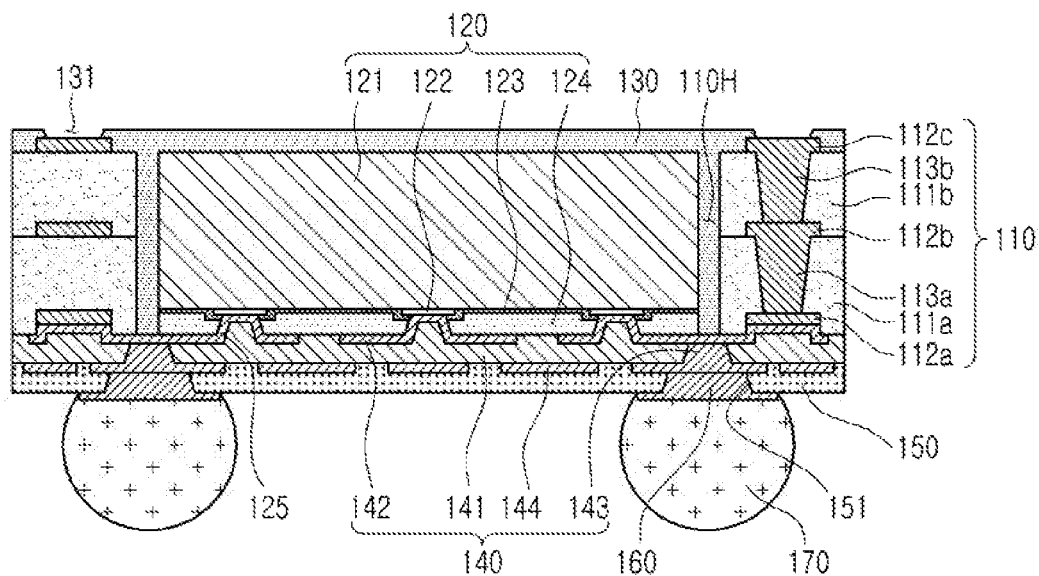
FIG. 12 is a cross-sectional view illustrating another example of a fan-out semiconductor package according to exemplary embodiments of the present disclosure.

FIG. 12 is a cross-sectional view illustrating another example of a fan-out semiconductor package according to exemplary embodiments of the present disclosure.

Referring to the drawing, in a fan-out semiconductor package according to another exemplary embodiment of the present disclosure, a second connection member 140 may include a plurality of layers. For example, the second connection member 140 may include an insulating layer 141 covering a first redistribution layer 142, a second redistribution layer 144 formed on the insulating layer 141, and vias 143 penetrating through the insulating layer 141 and connecting the first and second redistribution layers 141 and 144 to each other. A material of the insulating layer 141 may be the insulating material as described above, such as the PID resin, or the like. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like. Descriptions of configurations and manufacturing methods overlapping those provided above will be omitted hereinafter.

Figure 13:
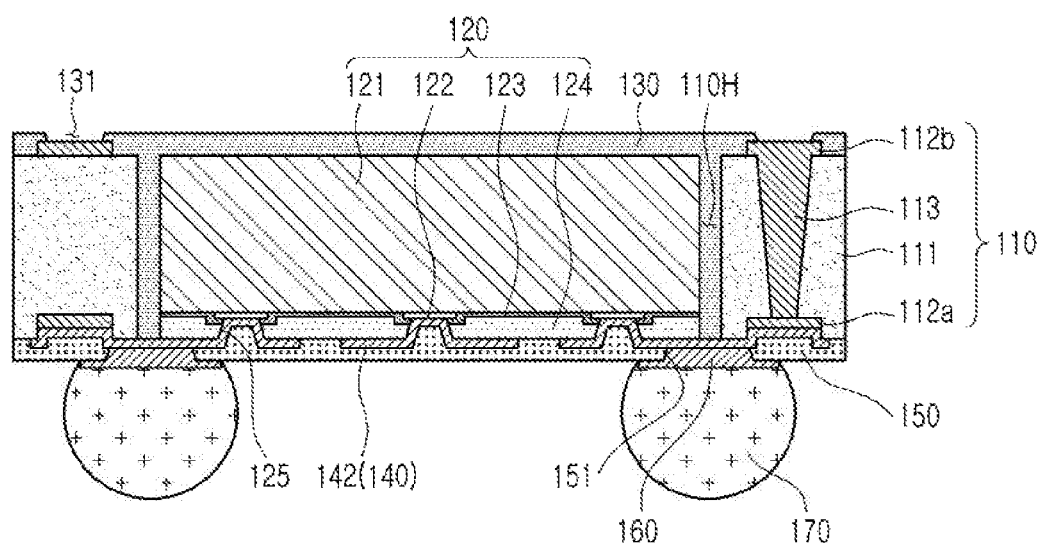
FIG. 13 is a cross-sectional view illustrating yet another example of a fan-out semiconductor package according to exemplary embodiments of the present disclosure.

FIG. 13 is a cross-sectional view illustrating another example of a fan-out semiconductor package according to exemplary embodiments of the present disclosure.

Referring to the drawing, in a fan-out semiconductor package according to another exemplary embodiment of the present disclosure, a first connection member 110 may include only a first redistribution layer 112a and a second redistribution layer 112b. That is, the number of redistribution layers 112a and 112b of the first connection member 110 may be adjusted, if necessary. Descriptions of configurations and manufacturing methods overlapping those provided above will be omitted hereinafter.

As set forth above, according to exemplary embodiments of the present disclosure, a fan-out semiconductor package capable of being manufactured at a subminiature size and an ultra-thin thickness to reduce manufacturing costs, and a method of manufacturing the same, may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a semiconductor chip having an active surface with connection pads disposed thereon and an inactive surface opposing the active surface, and including a first passivation layer disposed on the active surface and a second passivation layer disposed on the first passivation layer;
an encapsulant covering at least a portion of a side surface of the semiconductor chip, the side surface of the semiconductor chip disposed between the active surface and the inactive surface of the semiconductor chip, and covering at least a portion of an outermost side surface of the second passivation layer of the semiconductor chip; and
a redistribution layer disposed below the second passivation layer of the semiconductor chip and the encapsulant,
wherein the redistribution layer is directly disposed on a lower surface of the second passivation layer of the semiconductor chip and extends onto a lower surface of the encapsulant, and
wherein the redistribution layer is in direct contact with the lower surface of the encapsulant, and
wherein the side surface of the semiconductor chip and the outermost side surface of the second passivation layer are coplanar with each other.

2. The fan-out semiconductor package of claim 1, wherein the first and second passivation layers have openings penetrating therethrough, the openings exposing at least part of the connection pads, and
the redistribution layer is disposed on the exposed connection pads and walls of the openings, resulting in contact between the redistribution layer and the connection pads of the semiconductor chip.

3. The fan-out semiconductor package of claim 1, further comprising a connection member having a through-hole, with the semiconductor chip disposed in the through-hole of the connection member, and including a wiring layer,
wherein the connection member has a recessed portion formed in one surface thereof, the recessed portion being in contact with the redistribution layer, and
the redistribution layer being disposed in the recessed portion, resulting in contact between the redistribution layer and the wiring layer of the connection member.

4. The fan-out semiconductor package of claim 1, wherein the lower surface of the second passivation layer and the lower surface of the encapsulant are disposed on the same level.

5. The fan-out semiconductor package of claim 1, wherein the first passivation layer includes at least one of an oxide layer and a nitride layer, and
the second passivation layer includes an organic insulating layer.

6. The fan-out semiconductor package of claim 3, wherein the connection member includes a first insulating layer, a first wiring layer in contact with the redistribution layer and embedded in the first insulating layer, and a second wiring layer disposed on the other surface of the first insulating layer opposing one surface of the first insulating layer in which the first wiring layer is embedded.

7. The fan-out semiconductor package of claim 6, wherein the connection member further includes a second insulating layer disposed on the first insulating layer and covering the second wiring layer and a third wiring layer disposed on the second insulating layer.

8. The fan-out semiconductor package of claim 6, wherein a lower surface of the first wiring layer is recessed with respect to a lower surface of the first insulating layer.

9. The fan-out semiconductor package of claim 6, wherein the first wiring layer has a thickness greater than that of the redistribution layer.

10. The fan-out semiconductor package of claim 7, wherein the second wiring layer is disposed on a level between the active surface and the inactive surface of the semiconductor chip.

11. The fan-out semiconductor package of claim 1, wherein the encapsulant further covers at least a portion of an outermost side surface of the first passivation layer of the semiconductor chip.

12. The fan-out semiconductor package of claim 11, wherein the side surface of the semiconductor chip, the outermost side surface of the first passivation layer, and the outermost side surface of the second passivation layer are coplanar with each other.

* * * * *